United States Patent
Shen et al.

(10) Patent No.: US 8,994,052 B2
(45) Date of Patent: Mar. 31, 2015

(54) HIGH-EFFICIENCY LIGHT-EMITTING DEVICE AND MANUFACTURING METHOD THEREOF

(75) Inventors: Chien-Fu Shen, Hsinchu (TW); Chao-Hsing Chen, Hsinchu (TW); Chien-Fu Huang, Hsinchu (TW); Shih-I Chen, Hsinchu (TW); Chiu-Lin Yao, Hsinchu (TW); Chia-Liang Hsu, Hsinchu (TW); Chen Ou, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 220 days.

(21) Appl. No.: 13/161,835

(22) Filed: Jun. 16, 2011

(65) Prior Publication Data

US 2011/0241057 A1    Oct. 6, 2011

Related U.S. Application Data

(63) Continuation-in-part of application No. 12/073,284, filed on Mar. 4, 2008.

(51) Int. Cl.
*H01L 33/00* (2010.01)
*H01L 33/58* (2010.01)
*H01L 33/10* (2010.01)
*H01L 33/22* (2010.01)

(52) U.S. Cl.
CPC ............... *H01L 33/10* (2013.01); *H01L 33/22* (2013.01)
USPC ............ 257/98; 257/E33.001; 257/E33.073

(58) Field of Classification Search
CPC ............................. H01L 33/10; H01L 33/22
USPC ............... 257/98, E33.073, E33.001; 438/22
See application file for complete search history.

(56) References Cited

U.S. PATENT DOCUMENTS

| | | | |
|---|---|---|---|
| 6,420,732 B1 | 7/2002 | Kung et al. | |
| 6,504,180 B1 | 1/2003 | Heremans et al. | |
| 6,806,505 B2 * | 10/2004 | Kojima et al. | 257/86 |
| 7,977,694 B2 * | 7/2011 | David et al. | 257/98 |
| 7,989,828 B2 * | 8/2011 | Song | 257/98 |
| 8,008,646 B2 * | 8/2011 | Leem | 257/13 |
| 8,155,163 B2 * | 4/2012 | Saito et al. | 372/50.1 |
| 2007/0176191 A1 * | 8/2007 | Im | 257/98 |
| 2007/0221944 A1 | 9/2007 | Cheol Yoo | |
| 2008/0315220 A1 | 12/2008 | Lee et al. | |
| 2010/0252859 A1 * | 10/2010 | Son | 257/103 |
| 2010/0289043 A1 * | 11/2010 | Aurelien et al. | 257/98 |

* cited by examiner

*Primary Examiner* — Tom Thomas
*Assistant Examiner* — Benjamin Tzu-Hung Liu
(74) *Attorney, Agent, or Firm* — Muncy, Geissler, Olds & Lowe, P.C.

(57) ABSTRACT

A light-emitting device includes a first semiconductor layer; an active layer formed on the first semiconductor layer; a second semiconductor layer formed on the active layer; and a first pad formed on the second semiconductor layer, wherein the second semiconductor layer comprises a first region right under the first pad and a plurality of voids formed in the first region, wherein the region outside the first region in the second semiconductor layer is devoid of voids, and an area of the first region is smaller than that of the first pad in top view and the area of the first pad is smaller than that of the second semiconductor layer in top view, and the light emitted from the active layer is extracted from a top surface of the second semiconductor layer opposite the first semiconductor layer.

18 Claims, 2 Drawing Sheets

HIGH-EFFICIENCY LIGHT-EMITTING DEVICE AND MANUFACTURING METHOD THEREOF

RELATED APPLICATION

This application is a continuation-in-part application of U.S. patent application Ser. No. 12/073,284, entitled "A HIGH-EFFICIENCY LIGHT-EMITTING DEVICE AND MANUFACTURING METHOD THEREOF", filed on Mar. 4, 2008, the contents of which are incorporated herein by reference.

BACKGROUND

1. Technical Field

The present application relates to a light-emitting device, and more particularly, to a high-efficiency light-emitting device.

2. Description of the Related Art

Light-emitting devices such as light-emitting diodes (LEDs) have been applied widely in optical display devices, traffic signals, data storing devices, communication devices, illumination devices, and medical apparatuses. In the conventional LED, a metal layer, such as a Ti/Au or Cr/Au layer, is used as a pad. However, the pad absorbs light and results in low light-emitting efficiency of the LED. As a result, an LED includes a reflective metal layer formed between the pad and a light-emitting stacked layer for improving the light-emitting efficiency. However, the aforementioned structure brings about the reliability and peeling issues between the reflective metal layer and a light-emitting stacked layer because of the poor adhesion between the reflective metal layer with high reflectivity and a semiconductor layer of the light-emitting stacked layer.

SUMMARY OF THE DISCLOSURE

A light-emitting device comprises: a first semiconductor layer; an active layer formed on the first semiconductor layer; a second semiconductor layer formed on the active layer; and a first pad formed on the second semiconductor layer, wherein the second semiconductor layer comprises a first region right under the first pad and a plurality of voids formed in the first region, wherein the region outside the first region in the second semiconductor layer is devoid of voids, and an area of the first region is smaller than that of the first pad in top view and the area of the first pad is smaller than that of the second semiconductor layer in top view, and the light emitted from the active layer is extracted from a top surface of the second semiconductor layer opposite the first semiconductor layer.

A method of manufacturing a high-efficiency light-emitting device comprises the steps of: providing a light-emitting stacked layer, wherein the light-emitting stacked layer comprises a first semiconductor layer, an active layer, and a second semiconductor layer formed in this order, wherein the second semiconductor layer comprises a first region and a second region adjacent to the first region; forming a plurality of voids in the first region in the second semiconductor layer, wherein the region outside the first region in the second semiconductor layer is devoid of voids; and forming a first pad on the second semiconductor layer, wherein the first region is right under the first pad and an area of the first region is smaller than that of the first pad in top view, and the area of the first pad is smaller than that of the second semiconductor layer in top view, and the light emitted from the active layer is extracted from a top surface of the second semiconductor layer opposite the first semiconductor layer.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
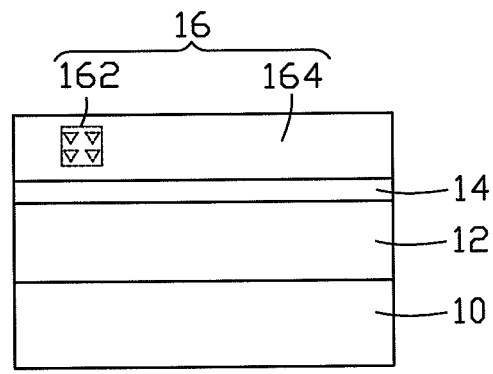
FIGS. 1A-1B illustrate a flow chart of the manufacturing process of a light-emitting device in accordance with one embodiment of the present application.
Figure 1B:
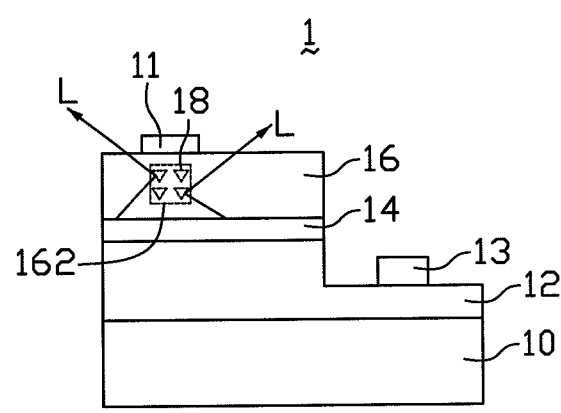
Figure 1C:
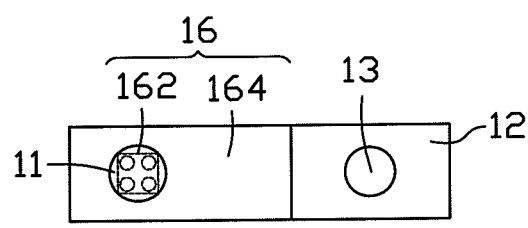
FIG. 1C illustrates a top view of the light-emitting device shown in FIG. 1B.

FIGS. 1A-1C disclose a light-emitting device 1 according to one embodiment of the present application. Referring to FIG. 1A, there is a light-emitting stacked layer formed on a substrate 10, wherein the light-emitting stacked layer includes a first light-emitting semiconductor layer 12, an active layer 14, and a second semiconductor layer 16. The second semiconductor layer 16 includes a first region 162 and a second region 164 adjacent to the first region 162. Namely, the second region 164 surrounds the first region 162. A plurality of voids 18 is formed in the first region 162. Referring to FIG. 1B, portions of the second semiconductor layer 16 and the active layer 14 are removed to expose a portion of the first semiconductor layer 12. Then, a first pad 11 and a second pad 13 are formed on the first region 162 in the second semiconductor layer 16 and the exposed portion of the first semiconductor layer 12 respectively to form the light-emitting device 1, wherein the first region 162 in the second semiconductor layer 16 is right under the first pad 11.

Referring to FIGS. 1B and 1C, the first pad 11 is formed above the plurality of voids 18. The refraction index of each of the plurality of voids 18 is smaller than that of the second semiconductor layer 16. The light L emitted from the active layer 12 can be reflected at the interface between the plurality of voids 18 and second semiconductor layer 16 because of total reflection which occurs when the light is emitted from the medium of high refraction index toward the medium of low refraction index. In the conventional light-emitting device, the light emitting toward the pad can be absorbed by the pad originally. However, most of the light L emitting toward the first pad 11 can be reflected toward other directions by the plurality of voids 18 and thus the amount of the light L absorbed by the first pad 11 in the light-emitting device 1 is reduced. As a result, the light extraction efficiency is improved because of the lower probability of the light absorbed by the first pad 11.

The substrate 10 can support the light-emitting stacked layer. The material of the support substrate 10 includes conductive material such as Diamond Like Carbon (DLC), graphite, carbon fiber, Metal Matrix Composite (MMC), Ceramic Matrix Composite (CMC), Polymer Matrix Composite (PMC), Ni, Cu, Mo, Al, Si, IP, ZnSe, GaAs, SiC, GaP, GaAsP, ZnSe, InP, LiGaO$_2$, or LiAlO$_2$, or insulating material such as sapphire, diamond, glass, epoxy, quartz, acryl, Al$_2$O$_3$, ZnO, or AlN.

The light-emitting stacked layer including the first semiconductor layer 12, the active layer 14, and the second semiconductor layer 16 can be grown on or bonded to the substrate 10, and generate light. The polarities of the first semiconductor layer 12 and the second semiconductor layer 16 are different. The material of the light-emitting stacked layer includes semiconductor material containing more than one element selected from a group consisting of Ga, Al, In, As, P, N, Zn, Cd, and Se.

The refraction index of each of the plurality of voids 18 is smaller than that of the second semiconductor layer 16. Furthermore, the refraction index of each of the plurality of voids 18 can be smaller than 2.4. The plurality of voids 18 is formed by several methods such as laser process or epitaxial lateral overgrowth (ELOG). For example, the plurality of voids 18 can be formed by utilizing stealth dicing (SD) laser to remove portions of the first region 162 in the second semiconductor layer 16. The plurality of voids 18 can contain air or inert gas. The inert gas can be N$_2$. The plurality of voids 18 can also contain dielectric material. For the plurality of voids 18 to contain dielectric material, a plurality of dielectric regions which contains dielectric material can be formed on the second semiconductor layer 16. Then, the material of the second semiconductor layer 16 can be deposited on the portion of the second semiconductor layer 16 where no dielectric regions covers thereon and coalesces above the plurality of dielectric regions to form the plurality of voids 18. The dielectric material can be polyimide (PI), benzocyclobutene (BCB), perfluorocyclobutane (PFCB), MgO, Su8, epoxy, acrylic resin, cyclic olefin copolymer (COC), polymethyl methacrylate (PMMA), polyethylene terephthalate (PET), polycarbonate (PC), polyetherimide, fluorocarbon polymer, glass, Al$_2$O$_3$, SiO$_x$, TiO$_2$, SiN$_x$, TiO, Y$_2$O$_3$, or spin-on-glass (SOG).

The first and second pads 11 and 13 are for receiving external voltage. The material of the first and second pads 11 and 13 can be metal material. The first pad 11 and the second pad 13 are on the same side of the active layer 14 in this embodiment, referring to FIG. 1B. In addition, the first pad 11 and the second pad 13 can also be on the opposite sides of the active layer 14 in another embodiment, for example. The metal material includes but is not limited to Cu, Al, In, Sn, Au, Pt, Zn, Ag, Ti, Pb, Pd, Ge, Ni, Cr, Cd, Co, Mn, Sb, Bi, Ga, Tl, Po, Ir, Re, Rh, Os, W, Li, Na, K, Be, Mg, Ca, Sr, Ba, Zr, Mo, La, Cr—Au, Ag—Ti, Cu—Sn, Cu—Zn, Cu—Cd, Sn—Pb—Sb, Sn—Pb—Zn, Ni—Sn, Ni—Co, Au alloy, and so on. The first pad 11 can include a pattern. The pattern can be a circle with a plurality of extensions extending radiatively from the circle, for example. The first region 162 in the second semiconductor layer 16 is right under the first pad 11 so the pattern of the first pad 11 is about the same as that of the first region 162.

Figure 2:
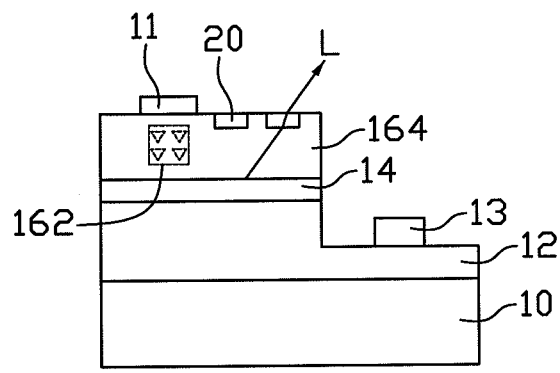
FIG. 2 illustrates a cross-sectional view of a light-emitting device in accordance with another embodiment of the present application.

FIG. 2 discloses a light-emitting device 2 according to another embodiment of the present application. The light-emitting device 2 includes the light-emitting stacked layer formed on the substrate 10, wherein the light-emitting stacked layer includes a first semiconductor layer 12, an active layer 14, and a second semiconductor layer 16. The second semiconductor layer 16 includes a first region 162 and a second region 164 adjacent to the first region 162. The first pad 11 and the second pad 13 are formed on the first region 162 in the second semiconductor layer 16 and the exposed portion of the first semiconductor layer 12 respectively, wherein first region 162 in the second semiconductor layer 16 is right under the first pad 11. The light-emitting device 2 further includes a plurality of high refraction index regions 20 formed in the second region 164. The refraction index of each of the plurality of high refraction index regions 20 is higher than that of the second semiconductor layer 16. If the material of the second semiconductor layer 16 is GaN, for example, the refraction index of each of the high refraction index regions 20 is larger than 2.4. The material of the high refraction index regions 20 can be TiO$_2$, MgO, CrO$_3$, or ZnSe. The direction of light L emitting toward the plurality of high refraction index regions 20 can be changed because of the difference of the refraction index of the plurality of high refraction index regions 20 and the second semiconductor layer 16. The direction of the light L can become closer to the direction perpendicular to the top surface of the active layer preferably after the light L passing the plurality of high refraction index regions 20.

Figure 3:
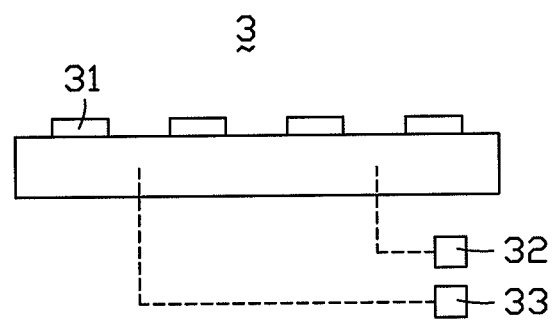
FIG. 3 illustrates a schematic diagram of a light-generating device in accordance with one embodiment of the present application.

FIG. 3 illustrates a schematic diagram of a light-generating device 3. The light-generating device 3 includes the light-emitting device of any one of the foregoing embodiments of the present application. A light-generating device 3 can be an illumination device such as a street light, a lamp of vehicle, or an illustration source for interior. The light-generating device 3 can be also a traffic sign or a backlight of a backlight module of an LCD. The light-generating device 3 includes a light source 31 adopting any foregoing light-emitting devices; a power supplying system 32 providing current to the light source 31; and a control element 33 controlling the power supplying system 32.

Figure 4:
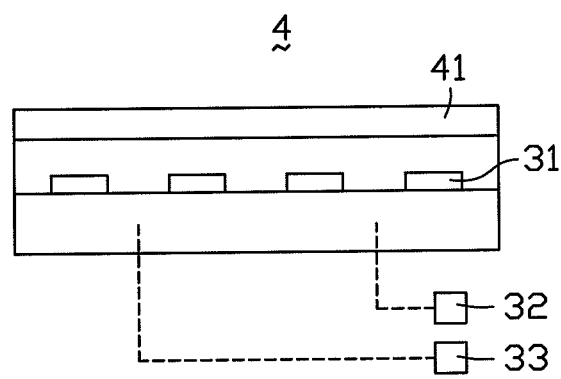
FIG. 4 illustrates a schematic diagram of a back light module in accordance with one embodiment of the present application.

FIG. 4 illustrates a schematic diagram of a back light module 4. A back light module 4 includes the light-generating device 3 of the foregoing embodiment and an optical element 41. The optical element 41 can process the light generated by the light-generating device 3 for LCD application, such as scattering the light emitted from the light-generating device 3.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
a first semiconductor layer;
an active layer formed on the first semiconductor layer;
a second semiconductor layer formed on the active layer; and
a first pad formed on the second semiconductor layer,
wherein the second semiconductor layer comprises a first region right under the first pad and a plurality of voids formed in the first region, wherein the region outside of the first region in the second semiconductor layer is devoid of voids, and an area of the first region is smaller than that of the first pad in top view and the area of the first pad is smaller than that of the second semiconductor layer in top view, and the light emitted from the active layer is extracted from a top surface of the second semiconductor layer opposite the first semiconductor layer.

2. The light-emitting device of claim 1 further comprising a substrate formed under the first semiconductor layer and the substrate comprises conductive material or insulating material.

3. The light-emitting device of claim 2, wherein the conductive material comprises material selected from a group consisting of DLC, graphite, carbon fiber, MMC, CMC, PMC, Ni, Cu, Mo, Al, Si, IP, ZnSe, GaAs, SiC, GaP, GaAsP, ZnSe, InP, $LiGaO_2$, and $LiAlO_2$.

4. The light-emitting device of claim 2, wherein the insulating material comprises material selected from a group consisting of sapphire, diamond, glass, epoxy, quartz, acryl, $Al_2O_3$, ZnO, and AlN.

5. The light-emitting device of claim 1, wherein material of the first semiconductor layer, the active layer, and/or the second semiconductor layer comprise more than one element selected from a group consisting of Ga, Al, In, As, P, N, Zn, Se, and Cd.

6. The light-emitting device of claim 1, wherein the plurality of voids contains air, inert gas, or dielectric material.

7. The light-emitting device of claim 6, wherein the dielectric material is selected from a group consisting of PI, BCB, PFCB, MgO, Su8, epoxy, acrylic resin, COC, PMMA, PET, PC, polyetherimide, fluorocarbon polymer, glass, $Al_2O_3$, $SiO_x$, $TiO_2$, $SiN_x$, TiO, $Y_2O_3$, and SOG.

8. The light-emitting device of claim 1, wherein the first pad comprises an extension.

9. The light-emitting device of claim 1, further comprising a second pad formed on the first semiconductor layer.

10. The light-emitting device of claim 1, wherein the second semiconductor layer comprises a second region adjacent to the first region and a plurality of high refraction index regions formed in the second region.

11. The light-emitting device of claim 10, wherein the plurality of high refraction index regions comprises material selected from a group consisting of $TiO_2$, MgO, $CrO_3$, and ZnSe.

12. The light-emitting device of claim 10, wherein the plurality of high refraction index regions fail to contact the active layer.

13. The light-emitting device of claim 12, wherein the refraction index of the plurality of high refraction index regions is higher than that of the second semiconductor layer.

14. The light-emitting device of claim 10, wherein the second region is devoid of the plurality of voids.

15. The light-emitting device of claim 10, wherein the refraction index of the plurality of high refraction index regions is higher than that of the second semiconductor layer.

16. The light-emitting device of claim 1, wherein the first pad has a pattern, and the plurality of voids is within the pattern.

17. A method of manufacturing a high-efficiency light-emitting device comprising the steps of:
providing a light-emitting stacked layer, wherein the light-emitting stacked layer comprises a first semiconductor layer, an active layer, and a second semiconductor layer formed in this order, wherein the second semiconductor layer comprises a first region and a second region adjacent to the first region;
forming a plurality of voids in the first region in the second semiconductor layer; wherein the region outside of the first region in the second semiconductor layer is devoid of voids, and
forming a first pad on the second semiconductor layer,
wherein the first region is right under the first pad and an area of the first region is smaller than that of the first pad in top view, and the area of the first pad is smaller than that of the second semiconductor layer in top view, and the light emitted from the active layer is extracted from a top surface of the second semiconductor layer opposite the first semiconductor layer.

18. The method of claim 17, wherein a method of forming the plurality of voids comprises laser process or ELOG.

* * * * *